United States Patent
Norton et al.

(10) Patent No.: US 7,862,331 B2
(45) Date of Patent: Jan. 4, 2011

(54) CATALYTIC MICROCOMBUSTORS FOR COMPACT POWER OR HEAT GENERATION

(75) Inventors: Daniel G. Norton, Niskayuna, NY (US); Eric Dean Wetzel, Baltimore, MD (US); Dionisios G. Vlachos, Voorhees, NJ (US)

(73) Assignee: University of Delaware, Newark, DE (US)

( * ) Notice: Subject to any disclaimer, the term of this patent is extended or adjusted under 35 U.S.C. 154(b) by 783 days.

(21) Appl. No.: 11/451,113

(22) Filed: Jun. 12, 2006

(65) Prior Publication Data

US 2007/0082310 A1    Apr. 12, 2007

Related U.S. Application Data

(60) Provisional application No. 60/691,990, filed on Jun. 17, 2005.

(51) Int. Cl.
*F23Q 11/00* (2006.01)
*F23D 3/40* (2006.01)

(52) U.S. Cl. .......................... 431/268; 431/7; 422/240

(58) Field of Classification Search ................. 431/268, 431/354, 7; 422/240; 126/208; 136/205
See application file for complete search history.

(56) References Cited

U.S. PATENT DOCUMENTS

| | | | |
|---|---|---|---|
| 3,969,149 A | 7/1976 | Thomas et al. | |
| 4,154,568 A * | 5/1979 | Kendall et al. | ................. 431/7 |
| 4,651,019 A | 3/1987 | Gilbert et al. | |
| 4,773,847 A | 9/1988 | Shukla et al. | |
| 4,870,824 A * | 10/1989 | Young et al. | ................... 60/723 |
| 5,599,181 A | 2/1997 | Aoki et al. | |
| 5,753,383 A | 5/1998 | Cargnelli et al. | |
| 5,824,947 A | 10/1998 | Macris | |
| 5,968,456 A | 10/1999 | Parise | |
| 6,062,210 A | 5/2000 | Welles | |
| 6,071,113 A * | 6/2000 | Tsubouchi et al. | ............. 431/7 |
| 6,193,501 B1 * | 2/2001 | Masel et al. | ................ 431/170 |
| 6,207,887 B1 | 3/2001 | Bass et al. | |
| 6,276,313 B1 | 8/2001 | Yang et al. | |
| 6,307,142 B1 | 10/2001 | Allen et al. | |
| 6,313,393 B1 * | 11/2001 | Drost | ........................ 136/201 |
| 6,367,261 B1 | 4/2002 | Marshall et al. | |
| 6,392,313 B1 | 5/2002 | Epstein et al. | |
| 6,393,824 B1 | 5/2002 | Kirner | |

(Continued)

OTHER PUBLICATIONS

Samuel B. Schaevitz et al., "A Combustion-based MEMS Thermoelectric Power Generator," The 11$^{th}$ International Conference on Solid State Sensors and Actuators, Munic, Germany; Jun. 10, 2001; pp. 30-33.

(Continued)

*Primary Examiner*—Kenneth B Rinehart
*Assistant Examiner*—Chuka C Ndubizu
(74) *Attorney, Agent, or Firm*—RatnerPrestia

(57) ABSTRACT

The present invention comprises a device which utilizes catalytic microcombustion for the production of heat or power and which exhibits a low pressure drop and has a high catalytic surface area. The catalytic microcombustor includes catalyst inserts in the reaction chamber separated by a sub millimeter distance. Thermal spreaders ensure temperature uniformity and maximum thermal efficiency. A mixing zone is prior to the combustion zone. Thermally conductive and/or insulating inserts are in the vicinity of the reaction zone.

35 Claims, 4 Drawing Sheets

U.S. PATENT DOCUMENTS

| | | | |
|---|---|---|---|
| 6,458,478 B1 | 10/2002 | Wang et al. | |
| 6,488,838 B1 * | 12/2002 | Tonkovich et al. | 208/108 |
| 6,497,571 B1 | 12/2002 | McAlonan et al. | |
| 6,541,676 B1 | 4/2003 | Franz et al. | |
| 6,560,167 B1 | 5/2003 | Kotanangi | |
| 6,613,972 B2 | 9/2003 | Cohen et al. | |
| 6,625,990 B2 | 9/2003 | Bell | |
| 6,653,005 B1 | 11/2003 | Muradov | |
| 6,670,539 B2 | 12/2003 | Heremans et al. | |
| 6,710,311 B2 | 3/2004 | Villa et al. | |
| 6,717,043 B2 | 4/2004 | Hasegawa et al. | |
| 6,747,178 B1 | 6/2004 | Harston et al. | |
| 6,770,471 B2 | 8/2004 | Barlocchi et al. | |
| 6,787,691 B2 | 9/2004 | Fleurial et al. | |
| 6,806,624 B2 | 10/2004 | Lee et al. | |
| 6,830,596 B1 | 12/2004 | Deckman et al. | |
| 6,872,879 B1 | 3/2005 | Serras et al. | |
| 7,407,381 B2 * | 8/2008 | Olstowski | 431/350 |
| 2004/0223908 A1 | 11/2004 | Holladay et al. | |
| 2005/0155639 A1 * | 7/2005 | Perlo et al. | 136/205 |
| 2005/0207953 A1 * | 9/2005 | Upadhye et al. | 422/240 |

OTHER PUBLICATIONS

Kazushi Yoshida et al., "High-Energy Density Miniature Thermoelectric Generator Using Catalytic Combusion," Journal of Microelectromechanical Systems, vol. 15, No. 1; Feb. 2006; pp. 195-203.

Kazushi Yosida et al., "Micro-Thermoelectric Generator using Catalytic Combustor," Int. Workshop on Power MEMS, Tsukuba, Japan; 2002.

* cited by examiner

CATALYTIC MICROCOMBUSTORS FOR COMPACT POWER OR HEAT GENERATION

CROSS-REFERENCE TO RELATED APPLICATION

This application is based on provisional application Ser. No. 60/691,990, filed Jun. 17, 2005.

GOVERNMENT LICENSE RIGHTS

The United States Government has rights in this invention which was done under CMR funding which is a program of the Center of Composite Materials funded by the Army Research Laboratory.

BACKGROUND OF INVENTION

A number of consumer, commercial and military applications require improved power sources for portable electronic equipment. Traditional batteries suffer from a number of limitations. In most applications, batteries are either too heavy or do not last long enough. Recharging times for reusable batteries are very slow (typically hours), and in fact the highest energy density batteries are single-use. Most battery chemistries also use heavy metals and other toxic materials, which present safety and health risk, as well as environmental disposal complications.

Electricity needed for portable electronic devices is typically generated using batteries. Existing batteries have low energy density, and as a result, they are too heavy or do not last sufficiently long.

Power generation utilizing hydrocarbons offers a promising alternative to traditional batteries. The energy density of hydrocarbons is significantly higher than that of batteries (approximately 40 for fuels vs. 0.5 MJ/kg for lithium-ion battery). A hydrocarbon-based device with an overall efficiency of approximately 1% or greater can therefore lead to improvements over current battery technology. Furthermore, hydrocarbon-based power systems can be continuously recharged simply by physical addition of more fuel.

Proton exchange membrane (PEM)-based fuel cells convert hydrogen directly into electricity. However, systems utilizing compressed $H_2$ produce low system-level energy density because of the high strength tanks required to store the gas at high pressures, and prevention of explosions is a major concern. Direct methanol fuel cells (DMFCs) suffer from crossover of methanol from the anode to the cathode, which depresses the cell voltage and results in fuel loss. System energy density is also reduced, since most DMFC devices require significant aqueous dilution of the methanol fuel. Solid oxide fuel cells are also being explored for the same objective but work at high temperatures creating issues with signature and have inherent safety issues due to gas phase chemistry that can lead to explosions.

Recent efforts have attempted to utilize combustion of hydrocarbons in miniature devices to directly produce heat or power. These devices typically utilize conventional homogeneous (gas-phase) combustion. A major disadvantage of homogeneous combustion is that operating temperatures are necessarily very high (>1500° C.). These high temperatures greatly limit material selection, burner life time, require extensive combustor insulation, and lead to significant $NO_x$ production and emissions. These high temperatures also present significant challenges for system compatibility with electronics, packaging, and personnel, and create thermal signatures that are undesirable for military applications. Another disadvantage of homogeneous combustion is that flames quench when confined between walls that are less than 1 mm apart, making it difficult to stabilize and maintain the reaction for long periods of time. These gap sizes can lead to combustors that are relatively bulky in size. A final disadvantage of homogeneous micro combustion devices is that many of them consist of complicated miniature parts, which are difficult and expensive to fabricate, and so far have exhibited efficiencies well below 1%.

An alternative to homogeneous microcombustion is to combust the fuel catalytically, without the production of a flame. When implemented in miniature devices, catalytic microcombustion has the potential to fully utilize the high energy densities of hydrocarbon fuels, but at much lower operating temperatures. Additionally, catalytic systems are typically easier to start, more robust to heat losses, and self-sustained at leaner fuel/air ratios. Finally, since catalytic combustion can be sustained in much smaller channels, catalytical microcombustors can potentially be designed into more compact geometries than homogeneous combustors.

Reaction rates increase with increasing catalyst surface area for a given reactor volume. Because of this, high surface areas reactors are constructed. These typically involve particulates in packed (fixed) bed and fluidized bed reactors. High surface areas provide leaner sustainable combustion, easier startup, potentially higher energy efficiency, and no emissions of unburned hydrocarbons or carbon monoxide. However, most of these particulate bed combustors require pumping the fuel-air mixture directly through the bed, which causes large pressure drops that limit overall system efficiency.

Herein we define microcombustors as devices with one or more physical dimensions being below one millimeter. We define catalytic combustion as combustion that does not involve flames. We use the terms combustor and reactor interchangeably. The equivalence ratio is defined as the fuel/air ratio normalized by the fuel/air ratio at stoichiometric conditions.

Devices have been previously described in U.S. Pat. Nos. 6,062,210, 6,497,571 B1, 6,541,676, 6,613,972, 6,710,311 B2, 6,747,178 B1, 6,770,471 B2, and 6,786,716 B1 that are microscale catalytic combustors that have a low pressure-drop, and low catalytic surface area. The catalytic surface area available is approximately that of the geometric surface area of the exposed catalyst support. The device according to the invention has a much higher specific surface area, which can lead to increased performance, especially at high flow rates.

In U.S. Pat. Nos. 6,750,596 B2 and 6,806,624 B2 devices are described that produce electrical power in microelectromechanical systems with moving parts. The device according to the invention requires no moving parts, and is therefore much simpler to fabricate and is likely to be more robust and durable.

In U.S. Pat. Nos. 4,651,019, 4,773,847, 5,599,181, 5,753,383, 5,968,456, 6,307,142 B1, 6,410,842 B1, 6,367,261 B1, 6,393,824 B1, 6,458,478 B1, 6,653,005 B1, and 6,830,596 B1 devices are described that consist of mesoscale and macroscale generation of electricity using thermoelectric devices. The thermoelectric devices utilize heat generated from combustion processes. These devices are different from those according to the invention because they are relatively large in size, and could not be easily miniaturized to a compact and portable geometry.

In U.S. Pat. Nos. 3,969,149, 5,824,947, 6,207,887, 6,560, 167 B1, 6,625,990 B2, 6,670,539 B2, 6,717,043 B2, 6,787, 691 B2, 6,872,879 B2 devices are described that generate electrical power utilizing microscale thermoelectric devices.

However, these devices only consist of the thermoelectric, without an integrated heat source. If power is to be generated, they must be combined in some fashion with a thermal gradient generator. In contrast, our device according to the invention consists of an integral heat source and thermoelectric device.

In Schaevitz, Franz et al. (*A combustion-based EMS thermoelectric power generator*, The 11th International Conference on Solid-State Sensors and Actuators, Munich, Germany; 2001) a microelectromechanical microcombustor-thermoelectric was fabricated. However, it had low catalyst surface area, and suffered from very low efficiencies (0.02%). In Yoshida, Kobayashi et al. (*Micro-thermoelectric generator using catalytic combustor*; Int. Workshop on Power MEMS, Tsukuba, Japan; 2002) a microcombustor and a thermoelectric device were fabricated and tested separately. In Yoshida, K. S. Tanaka, et al. (*High-Energy Density Miniature Thermoelectric Generator Using Catalytic Combustion*, J. MEMS 195-203; 2006) a microcombustor and thermoelectric device were integrated to produce electricity. However, it had low surface area and was unable to produce power from a hydrocarbon.

SUMMARY OF THE INVENTION

The present invention relates to techniques for producing electricity from hydrocarbons by coupling a thermoelectric element with a catalytic microcombustor. These systems currently exhibit efficiencies comparable to conventional batteries, but with virtually instant recharging (by simply adding more fuel) and negligible environmental impact. Due to the high energy density of hydrocarbons, these systems are also expected to eventually exhibit efficiencies significantly higher than traditional batteries. The micro reactors described herein could also be useful for synthesis of chemicals with improved yield and catalyst lifetime, inherent safety, and increased effective rates (process intensification).

THE DRAWINGS

DETAILED DESCRIPTION

The present invention has numerous advantages over the prior art. For example, our system contains no moveable parts and exhibits low pressure drop. It has the maximum reported thermal efficiency in converting the energy of fuels into electricity. It uses regular fuels, such as hydrocarbons or hydrogen, to generate the heat needed on the hot side of the thermoelectric. The single channel catalytic microcombustor supports combustion in very shallow gaps, significantly below 1 mm, and achieves high transport rates and complete conversion of the fuel. It controls the temperature uniformity by suitable material design and selection at the hot side of the thermoelectric to increase efficiency. It allows control of the maximum temperature exposed to the hot side of the thermoelectric to avoid damage of the thermoelectric element. It exhibits no detectable emissions of hydrocarbons or carbon monoxide. It allows control of temperature profiles for improved catalyst life time and performance of reactors for synthesis of chemicals. A stable combustion temperature may be optimized through adjustment of exemplary parameters including: fuel type, equivalence ratio, gap size, flow rate, and wall characteristics. Exemplary such wall characteristics may include: thermal conductivity, thickness, porosity, surface geometry, and non-homogeneity. Due to their dimensions being below the critical quenching distance, these microburners are inherently safe with respect to flash back and explosion. Electricity can be produced continuously by simply supplying fuel and air. The systems developed have lower environmental impact compared to batteries, and virtually instant recharging.

Figure 1:
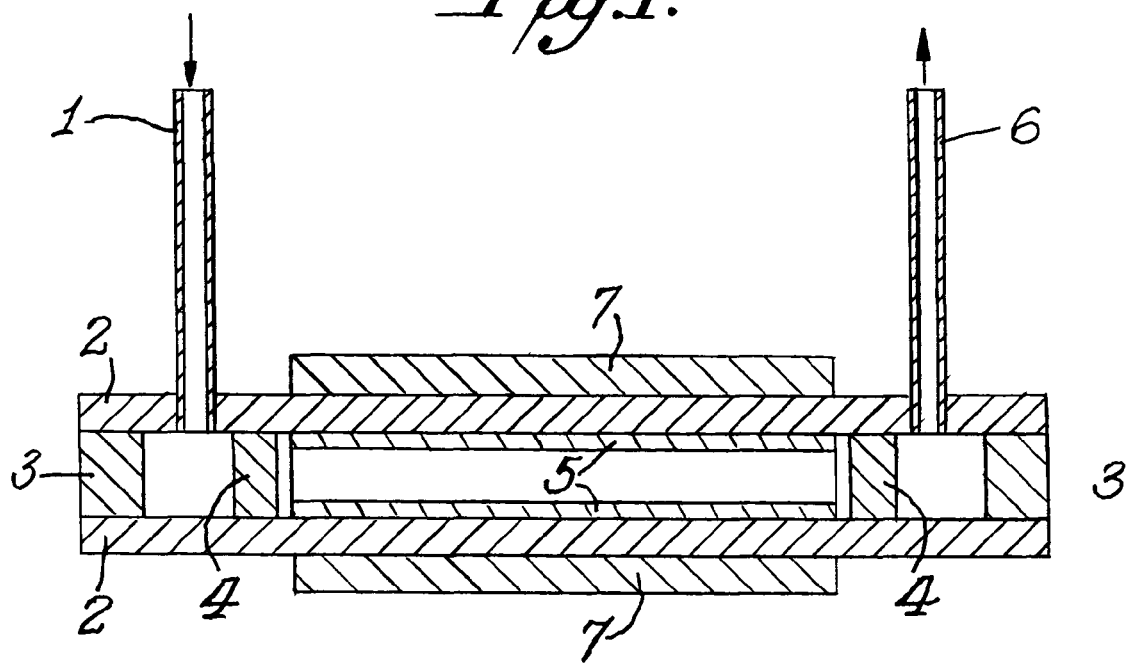
FIG. 1 is a schematic view of a microcombustor with static micromixer(s), catalytic insert supports and thermal spreaders on the outside walls.
Figure 2:
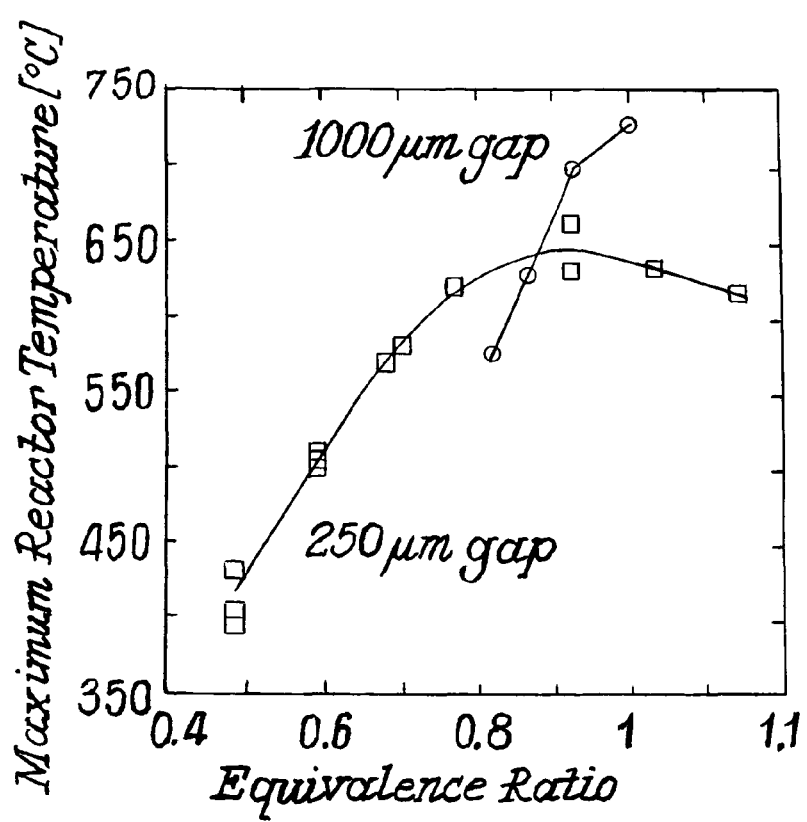
FIG. 2 is a graph illustrating the sustainable range of microburner temperatures and compositions which can be improved by varying the gap size; the data shown is for self-sustained catalytic combustion of propane in air.

The microcombustors are depicted schematically in FIG. 1. To form the reaction chamber, a gasket 3 is sandwiched between plates resulting in a channel gap whose dimensions can vary. The reactor wall 2 can be made of metal or ceramics. We have fabricated walls made of stainless steel and ceramics. The inlet 1 and outlet 6 of the reaction chamber are formed by attaching tubing to opposite ends of the channel. To eliminate jetting of the reactive mixture, one or two static mixers 4 are integrated into the microcombustor. The system is made airtight with a series of nuts and bolts around the perimeter of the channel or by high temperature adhesive (not shown). Catalytic insert supports 5 of high surface area are constructed and are placed in the channel and held against the top and bottom with small pieces of fibrous alumina. The open area of the channel results in small pressure drops. By varying the channel gap size, we can vary the reactivity of the channel and thus its performance, as shown in FIG. 2. Variables that can be changed include the maximum temperature, the composition limits for self-sustained combustion, the ignition temperature, and the extinction temperature. The gap size of the chamber channel and/or wall characteristics of the chamber may be selected to optimize characteristics such as, for example, efficiency, pressure drop, fuel conversion, pollutant emissions, thermal uniformity, yield in chemical synthesis, microcalorimetric measurements, and flammability limits.

The catalytic insert supports 5 consist of anodized aluminum. They are fabricated by completely anodizing an aluminum foil to create thin alumina sheets that serve as high surface area porous catalyst supports. An alloy aluminum foil is immersed in aqueous oxalic acid. The system is held at low temperature during this process. The pores travel the thickness of the insert. The pore structure is semi-ordered and provides large surface areas compared to the geometric surface area. We have fabricated supports 5 with surface area of 1500 $m^2$ per geometric surface area. To deposit catalyst onto the insert support 5, different deposition techniques are used. We have immersed the alumina supports into an aqueous dihydrogen hexacholoroplatinate (IV) solution and carried deposition. The pH of the solution was adjusted to maximize catalyst deposit. The inserts are then removed from the solution, dried, and the dihydrogen hexachloroplatinate (IV) is finally reduced to platinum metal with $H_2$ at high temperatures. We have done similar deposition with Rh catalyst using rhodium (III) chloride salt ($RhCl_3$). Because the high surface area pores are along the walls of the combustor, rather directly in the flow path of the fuel-air mixture, a high surface area catalyst support is created which does not restrict flow. This design enables the high surface area and low pressure drop characteristic of our system.

Integration of microcombustors with thermoelectrics requires control of maximum temperature of the microcombustor wall and of the wall temperature uniformity. Temperature gradients along the hot side of a thermoelectric element lead to loss of efficiency. Furthermore, temperature control of the walls of microreactors can maximize yield of chemical processes, suppress hot spots, and permit longer catalyst lifetime.

Figure 3:
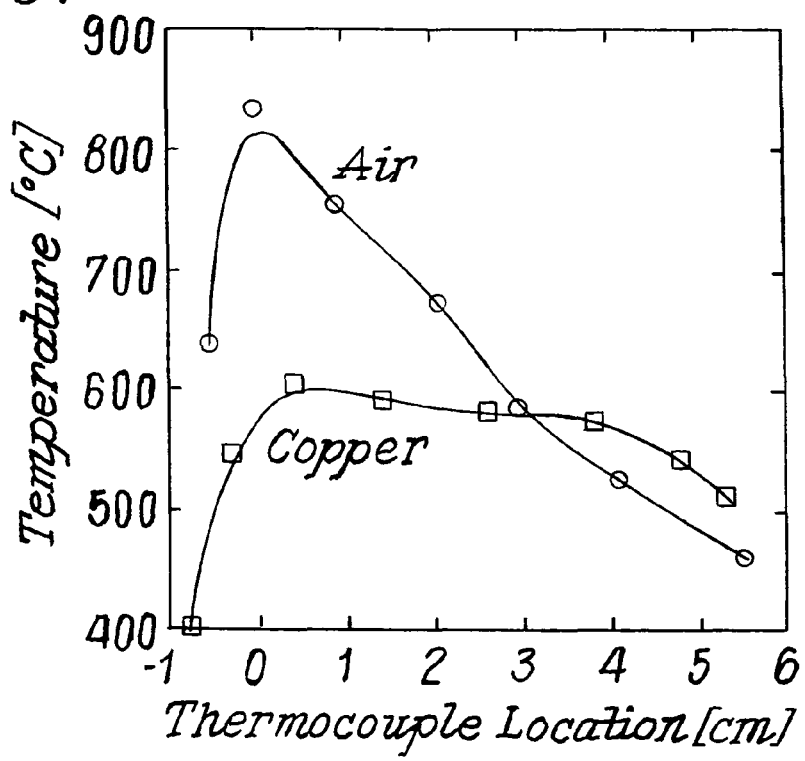
FIG. 3 is a graph showing the effect of outside wall material (thermal spreader) on temperature uniformity of the microcombustor wall; the catalytic wall extends from 10 to 5 cm; the data shown is for self-sustained catalytic combustion of hydrogen in air.
Figure 4:
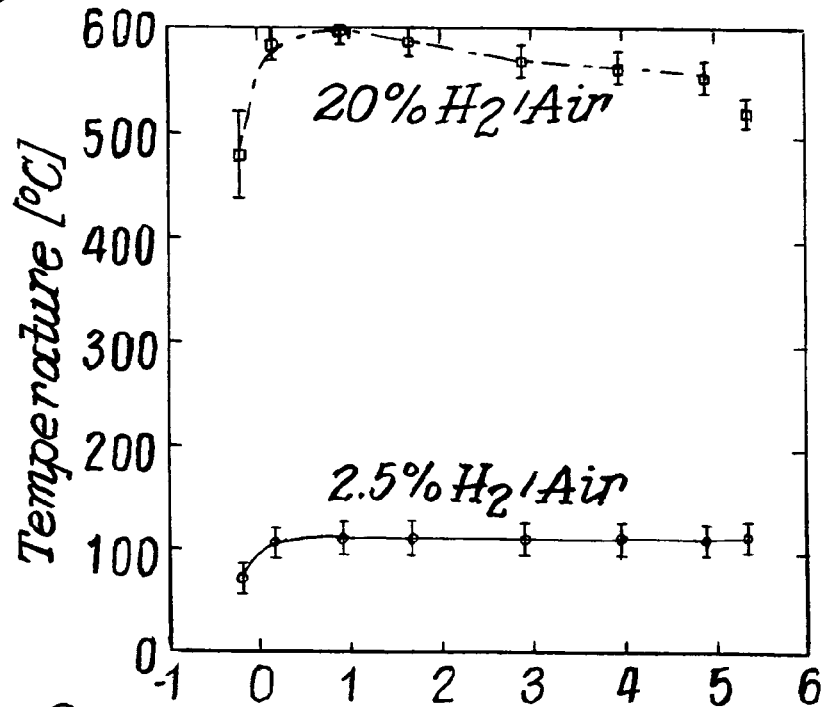
FIG. 4 is a graph showing the thermal uniformity that can be achieved at various compositions using thermal spreaders; the data shown is for self-sustained catalytic combustion of hydrogen in air.

In order to effectively manipulate the thermal uniformity of the reactor walls, conducting wall thermal spreaders 7 of different thermal conductivities and thickness are adhered to the exterior of the reactor walls (see FIG. 1) with colloidal silver paste. The silver paste is hardened by drying under ambient conditions, followed by curing. Thermal spreaders 7 have the same width and length as the catalytic insert support 5. Additionally, the entire burner is enclosed in an insulating fibrous alumina jacket (not shown). FIG. 3 illustrates that suitable thermal spreaders greatly improve thermal uniformity within the catalyst zone. Thermal uniformity can be achieved for various flow rates, compositions, maximum temperatures, and fuels. An example is shown in FIG. 4.

Experiments can be conducted using a variety of fuel/oxidant mixtures or a mixture of fuels and an oxidant. We have carried out experiments using hydrogen/air, methane/air, carbon monoxide/air, and propane/air mixtures, as well as mixtures of carbon monoxide and hydrogen in air. Mass flow controllers control the flow rates. The exhaust gasses are determined by gas chromatography, using a thermal conductivity detector and a flame ionization detector. The fuel mixture may be ignited in the microcombuster by methods such as, for example, self-ignition, an electric spark, a heating element, or by utilizing hydrogen during startup when using a non-hydrogen fuel for sustained operation. No emissions of unburned hydrocarbons and no carbon monoxide are detectable under fuel lean conditions, far from extinction conditions.

Figure 6:
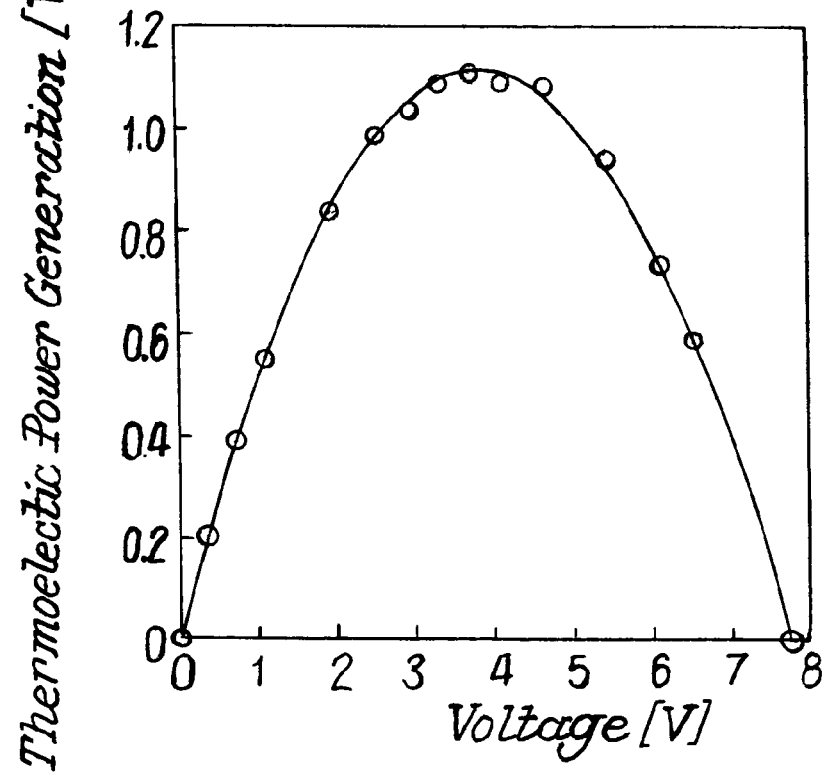
FIG. 6 is a graph showing the power generated from integrated microcombustor/thermoelectric device for hydrogen/air mixtures as a function of voltage.
Figure 5:
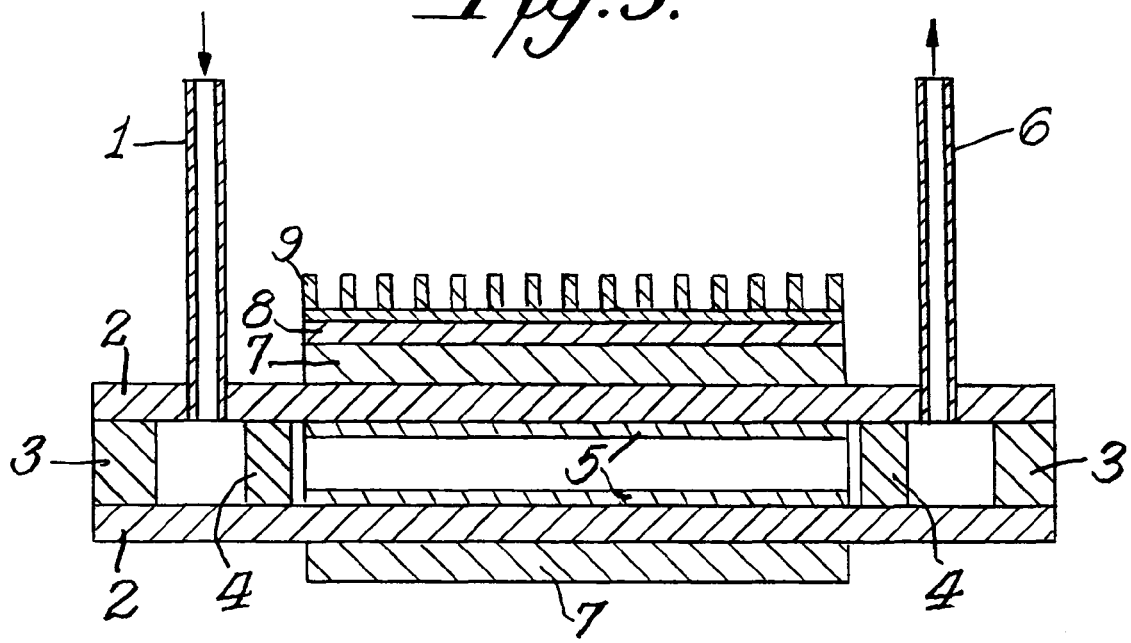
FIG. 5 is a schematic view of a microcombustor with single integrated thermoelectric device and heat sink.
Figure 7:
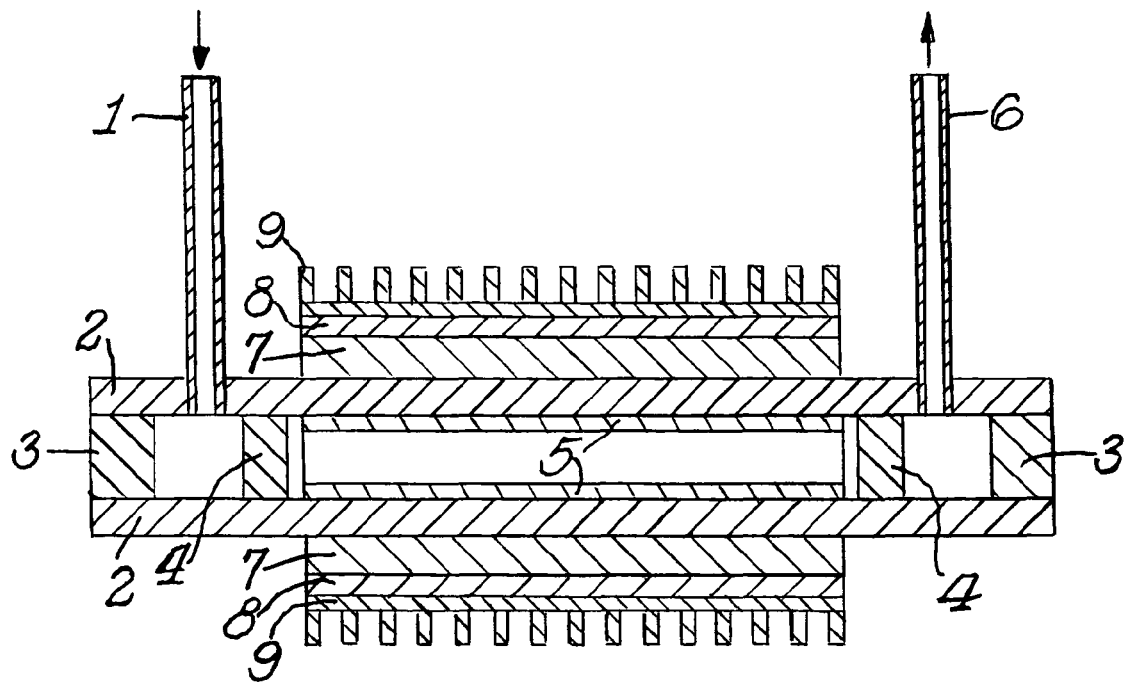
FIG. 7 is a view similar to FIG. 5 of a microcombustor with two thermoelectric devices.

The integrated thermoelectric/catalytic microcombustor devices consist of the microcombustors described above, a thermoelectric device, and a heat sink 9 (FIG. 5). The thermoelectrics used were Model HZ-2 from Hi-Z Technology, Inc. (San Diego, Calif.). The devices are approximately 2.9 cm wide×2.9 cm long×0.5 cm thick, weight 13.5 g, and are rated for output 2.5 W at 3.3 V. The integrated device has successfully produced electricity as shown in FIG. 6, using a single thermoelectric device 8. The performance of the device improves as the temperature uniformity of the microcombustor wall increases and as the temperature difference across the thermoelectric element increases. Additionally, using two thermoelectric devices 8,8 (on each side of the reaction channel, as shown in FIG. 7) results in larger power generation.

All the references described above are incorporated herein in their entirety by reference thereto.

Catalytic microcombustors are characterized by the physical dimension (i.e. gap height) between the two catalyst inserts. The width controls the flow velocity and could be used to adjust flow rate and the power generation. The microcombustor length has to be sufficiently long to ensure complete fuel utilization. The gap height is preferably greater than 1 μm and less than 5 mm, and most preferably greater than 100 μm and less than 1 mm. The overall microcombustor dimensions, including mixing zone, combustion zone, thermal spreaders, and insulation, is preferably less than 5000 ml in volume, and most preferably less than 500 ml in volume. The present invention includes in the catalytic microcombustor at least one high surface area catalyst insert with low pressure drop and preferably with sub millimeter distance or gap height between the inserts to ensure safety and enhanced performance. In an exemplary embodiment, the pressure drop in the microcombuster may be less than 100 Pa/m. Thermal spreaders ensure temperature uniformity and maximum thermal efficiency. Preferably there is a mixing zone prior to the combustion zone to achieve good mixing of reactants, and thermally conductive and/or insulating inserts to modify heat transfer and heat exchange in the vicinity of the reaction zone. A further advantage of the catalytic microcombustors of this invention is that there are no movable parts. The integration of all of these components is unique.

While there is shown and described certain specific structures embodying the invention, it will be manifest to those skilled in the art that various modifications and rearrangements of the parts may be made without departing from the spirit and scope of the underlying inventive concept and that the same is not limited to the particular forms herein shown and described.

What is claimed is:

1. A device for producing heat or power comprising:
   a catalytic microcombustor having a reaction chamber formed by one or more walls that define a channel as a catalytic zone;
   a fuel inlet tube communicating with said chamber at a first location:
   an exit tube communicating with said chamber at a second location remote from said first location;
   at least two thermal spreaders conductively mounted to the one or more walls of the reaction chamber external to said chamber said thermal spreaders adapted to increase thermal uniformity in said reaction chamber as compared to an identical said reaction chamber without said thermal spreaders; and
   two spaced catalytic inserts disposed on the one or more walls of said reaction chamber with said channel between them, each of said catalytic inserts comprising a catalyst.

2. The device of claim 1, further comprising a mixing zone prior to the reaction chamber for mixing of reactants.

3. The device of claim 2, wherein said mixing zone comprises a static mixer.

4. The device of claim 1, wherein each catalytic insert comprises a nanoporous substrate for supporting the catalyst.

5. The device of claim 1, wherein said microcombustor has no movable parts in operation.

6. The device of claim 1, further comprising at least a first thermoelectric element coupled to said microcombustor.

7. The device of claim 6, further comprising at least a first heat sink mounted externally to said first thermoelectric element.

8. The device of claim 6, further comprising a second thermoelectric element and a second heat sink diametrically opposite said first thermoelectric element and heat sink.

9. The device of claim 1 wherein the two catalytic inserts have a gap between them greater than 1 μm and less than 5 mm.

10. The device of claim 9 wherein the gap between said catalytic inserts is greater than 100 μm and less than 1 mm.

11. The device of claim 1, comprising two said thermal spreaders conductively mounted to the walls of the reaction chamber.

12. The device of claim 1, wherein said thermal spreader has a length coextensive with the reaction chamber.

13. The device of claim 1, wherein the one or more walls of the reaction chamber comprise a pair of plates, the plates having a channel gap dimension between them, the channel gap dimension defined by a gasket sandwiched between the plates.

14. A device for producing heat or power comprising,
   a catalytic microcombustor having a reaction chamber formed by one or more walls that define a channel as a catalytic zone;
   a fuel inlet tube communicating with said chamber at a first location:
   an exit tube communicating with said chamber at a second location remote from said first location:
   at least one thermal spreader conductively connected to the reaction chamber a said thermal spreader adapted to increase thermal uniformity in said reaction chamber as compared to an identical said reaction chamber without said thermal spreader; and
   two spaced catalytic inserts disposed on the one, or more walls of said reaction chamber with said channel between them, each of said catalytic inserts comprising a catalyst and having a ratio of catalytic surface area to geometric surface area greater than 100 $m^2/m^2$.

15. A method of producing heat or power, the method comprising:
   (a) providing a catalytic microcombustor having a reaction chamber formed by one or more walls that define a channel as a catalytic zone;
      a fuel inlet tube communicating with said chamber at a first location:
      an exit tube communicating with said chamber at a second location remote from said first location;
      at least two thermal spreaders conductively mounted to the one or more walls of the reaction chamber external to said chamber said thermal spreaders adapted to increase thermal uniformity in said reaction chamber as compared to an identical said reaction chamber without said thermal spreaders; and
      two spaced catalytic inserts disposed on the one or more walls of said reaction chamber with said channel between them, each of said catalytic inserts comprising a catalyst; and
   (b) feeding a fuel through an inlet tube into the reaction chamber of the catalytic microcombustor.

16. The method of claim 15 further comprising mixing the fuel for the catalytic microcombustor in a mixing zone upstream of the reaction chamber.

17. The method of claim 16, further comprising providing the two catalytic inserts in the reaction chamber with a distance between them of less than 1 millimeter.

18. The method of claim 17, wherein the pressure drop in the microcombustor is less than 100 Pa/m.

19. The method of claim 15, comprising converting heat generated by microcombustion to electricity using a thermoelectric device.

20. The method of claim 19, comprising using the converted electricity to power an object selected from the group consisting of personal electronic devices, sensors, controllers, environmental monitors, remote devices, power harvesting devices, auxiliary power, and vehicles.

21. The method of claim 15, comprising converting heat generated by microcombustion to mechanical work using a thermomechanical device.

22. The method of claim 21, wherein the thermomechanical device is selected from the group consisting of wax actuators, shape memory alloys, and thermally expanding polymers.

23. The method of claim 22, comprising using the mechanical work to generate electricity.

24. The method of claim 15, wherein heat generated by microcombustion is used to convert a fuelstock to hydrogen, which is then used to generate electricity in a fuel cell.

25. The method of claim 15, wherein reactants in the reactant chamber undergo an expansion during combustion that is used to perform mechanical work.

26. The method of claim 15, wherein the catalytic insert comprises a nanoporous substrate for supporting the catalyst.

27. The method of claim 15, wherein the fuel comprises a fuel selected from the group consisting of hydrogen, methane, carbon monoxide, and propane.

28. The method of claim 15, further comprising igniting the fuel in the microcombustor by one of: self-ignition, an electric spark, a heating element, and using hydrogen during startup when using a non-hydrogen fuel for sustained operation.

29. The method of claim 15, further comprising optimizing a stable combustion temperature by adjusting parameters selected from the group consisting of: fuel type, equivalence ratio, gap size, flow rate, and wall characteristics, and wherein the wall characteristics are selected from the group consisting of: thermal conductivity, thickness, porosity, surface geometry, and non-homogeneity.

30. The method of claim 15, further comprising selecting a distance between the two catalytic inserts in the microcombustor to optimize efficiency, pressure drop, fuel conversion, pollutant emissions, thermal uniformity, and flammability limits.

31. The method of claim 15, further comprising selecting wall characteristics of the chamber to optimize efficiency, pressure drop, fuel conversion, pollutant emissions, thermal uniformity, yield in chemical synthesis, microcalorimetric measurements, and flammability limits.

32. The method of claim 15, wherein the generated heat is used for a use selected from the group consisting of warmth for an individual, accelerating a chemical reaction, sustaining a living or biological system, measurement of heat release rate, and as a hydrogen sensor.

33. A device for producing heat or power comprising:
   a catalytic microcombustor having a reaction chamber formed by one or more walls that define a channel as a catalytic zone;
   a fuel inlet tube communicating with said chamber at a first location:
   an exit tube communicating with said chamber at a second location remote from said first location;
   a mixing zone prior to the reaction chamber for mixing of reactants;
   at least one thermal spreader conductively connected to the reaction chamber said thermal spreader adapted to increase thermal uniformity in said reaction chamber as compared to an identical said reaction chamber without said thermal spreader; and
   two spaced catalytic inserts disposed on the one or more walls of said reaction chamber with said channel between them, each of said catalytic inserts comprising a catalyst selected from the group consisting of: platinum or rhodium.

34. A device for producing heat or power comprising:
   a catalytic microcombustor having a reaction chamber formed by one or more walls that define a channel as a catalytic zone;
   a fuel inlet tube communicating with said chamber at a first location:

an exit tube communicating with said chamber at a second location remote from said first location;

at least one thermal spreader conductively connected to the reaction chamber said thermal spreader adapted to increase thermal uniformity in said reaction chamber as compared to an identical said reaction chamber without said thermal spreader; and two spaced catalytic inserts disposed on the one or more walls of said reaction chamber with said channel between them, each of said catalytic inserts comprising a catalyst and an anodized aluminum nanoporous substrate for supporting the catalyst.

35. A device for producing heat or power comprising:

a catalytic microcombustor having a reaction chamber formed by one or more walls that define a channel as a catalytic zone;

a fuel inlet tube communicating with said chamber at a first location;

an exit tube communicating with said chamber at a second location remote from said first location;

two thermal spreaders conductively mounted to the walls of the reaction chamber external to the reaction chamber said thermal spreaders adapted to increase thermal uniformity in said reaction chamber as compared to an identical said reaction chamber without said thermal spreaders; and two catalytic inserts mounted to the walls of the reaction chamber internal to the reaction chamber, said catalytic inserts comprising a catalyst, with said channel disposed between said catalytic inserts, wherein the two thermal spreaders and the two catalytic inserts all have a same length and width.

* * * * *